(12) United States Patent
Haixiong

(10) Patent No.: US 6,625,030 B1
(45) Date of Patent: Sep. 23, 2003

(54) WIRELESS TERMINAL ASSEMBLY

(75) Inventor: Zhao Haixiong, Holmdel, NJ (US)

(73) Assignee: Mobicom Corporation, Holmdel, NJ (US)

( * ) Notice: Subject to any disclaimer, the term of this patent is extended or adjusted under 35 U.S.C. 154(b) by 0 days.

(21) Appl. No.: 09/544,740

(22) Filed: Apr. 7, 2000

(51) Int. Cl.[7] ............................................... H05K 1/14
(52) U.S. Cl. ..................... 361/737; 361/680; 455/572; 455/90
(58) Field of Search .................. 455/572, 573, 455/566, 570, 575, 90, 349; 361/680, 737, 814

(56) References Cited

U.S. PATENT DOCUMENTS

| | | | | |
|---|---|---|---|---|
| 4,635,354 A | * | 1/1987 | Chrobak et al. | 29/622 |
| 5,555,157 A | * | 9/1996 | Moller et al. | 361/683 |
| 5,661,634 A | * | 8/1997 | Obata et al. | 361/984 |
| 5,864,766 A | * | 1/1999 | Chiang | 455/572 |
| 5,924,044 A | * | 7/1999 | Vannatta et al. | 455/556 |
| 6,164,531 A | * | 12/2000 | Harris et al. | 235/380 |
| 6,219,257 B1 | * | 4/2001 | Arnold | 361/814 |

* cited by examiner

Primary Examiner—David Martin
Assistant Examiner—Thanh S. Phan
(74) Attorney, Agent, or Firm—DeMont & Breyer, LLC

(57) ABSTRACT

A wireless terminal assembly is disclosed that is thinner that some wireless terminal assemblies in the prior art. In accordance with the first illustrative embodiments of the present invention, the display module and battery module are mounted on the same side of a single printed circuit board. The first illustrative embodiment of the present invention comprises: a printed circuit board assembly having a first face and a second face; a display module that is mounted on the first face of the printed circuit board assembly and that is electrically connected to the printed circuit board assembly; and a battery module that is removably-mounted on the first face of the printed circuit board assembly, wherein the battery module is electrically connected to the printed circuit board assembly when the battery module is mounted on the first face of the printed circuit board assembly.

20 Claims, 3 Drawing Sheets

400

400

600

600

WIRELESS TERMINAL ASSEMBLY

FIELD OF THE INVENTION

The present invention relates to telecommunications equipment in general, and, more particularly, to a wireless terminal assembly that is used with a wireless telecommunications system.

BACKGROUND OF THE INVENTION

As wireless telecommunications (e.g., cellular telephony, paging services, etc.) have become popular, manufacturers of wireless terminals (e.g., cellular telephones, pagers, personal digital assistants, etc.) have sought to make their wireless terminals dimensionally smaller and lighter than those of their competitors. In fact, many prospective purchasers select one model of wireless terminal over another model principally because of the relative size of the two models, and extremely small wireless terminals often command a huge price premium in the marketplace.

Therefore, the need exists for smaller wireless terminals.

SUMMARY OF THE INVENTION

The present invention is a wireless terminal assembly that enables a thinner wireless terminal to be fabricated than some assemblies in the prior art. In the prior art, the display module and battery module of a wireless terminal assembly are mounted on different faces of a printed circuit board assembly. And because the display module and the battery module are typically the thickest modules in the wireless terminal assembly, the overall thickness of the wireless terminal assembly is typically constrained by the sum of the thicknesses of the display module, the printed circuit board assembly and the battery module.

In contrast, and in accordance with the first illustrative embodiments of the present invention, the display module and battery module are mounted on the same side of a single printed circuit board. In this case, the overall thickness of the wireless terminal assembly is, instead, constrained by the sum of the thickness of the printed circuit board plus the thicker of the display module and the battery module. In general, the illustrative embodiments provide a thinner wireless terminal assembly than some assemblies in the prior art without a fundamental change in the basic technology with which the individual components of both assemblies are made.

Often, however, the display module and the battery module cannot be summarily mounted on the same side of a printed circuit board without other changes being made to the wireless terminal assembly. For example, if the display module and battery module are mounted on the same side of a printed circuit board, some accommodation must be made for where to put the keypad, if there is one. In accordance with one illustrative embodiment of the present invention, each battery module is fabricated with a thin permanently-integrated keypad. In general, this is economically acceptable because the cost of the keypad is typically small in comparison to the cost of the battery module and the wireless terminal assembly overall.

Some embodiments of the present invention comprise: a printed circuit board assembly having a first face and a second face; a display module that is mounted on the first face of the printed circuit board assembly and that is electrically connected to the printed circuit board assembly; and a battery module that is removably-mounted on the first face of the printed circuit board assembly, wherein the battery module is electrically connected to the printed circuit board assembly when the battery module is mounted on the first face of the printed circuit board assembly.

DETAILED DESCRIPTION

Figure 1:
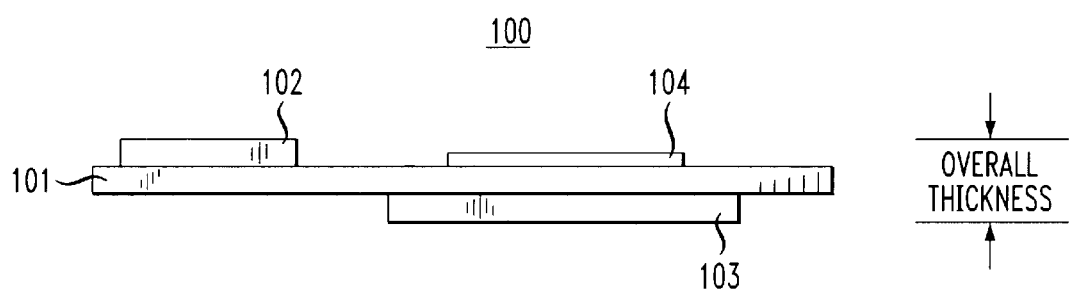
FIG. 1 depicts a side-view of a wireless terminal assembly in the prior art.

FIG. 1 depicts a side-view of wireless terminal assembly 100 in the prior art. Wireless terminal assembly 100 comprises: printed circuit board assembly 101, display module 102, battery module 103, and keypad 104. It is well-known to those skilled in the art how to make and use printed circuit board assembly 101, display module 102, battery module 103, and keypad 104. Although not all of the components found in a typical wireless terminal assembly are depicted in FIG. 1 (e.g., a speaker, etc.), those components that most facilitate an understanding of the illustrative embodiments of the present invention are shown.

For the purposes of this specification, a "printed circuit board assembly" is defined as one or more mechanically interconnected printed circuit boards. For the purposes of this specification, a "display module" is defined as a device that presents information in a visual and human-perceivable form. Examples of display modules include, but are not limited to, a liquid crystal display, a light-emitting diode display, a plasma display, etc. Furthermore, a display module can comprise a keypad as in, for example, a touch-sensitive display. For the purposes of this specification, a "battery module" is defined as a power source. Examples of battery modules include, but are not limited to, a single cell electro-chemical battery, a multi-cell electro-chemical battery, a fuel cell, a photovoltaic cell, etc., and any combination of these. For the purposes of this specification, a "keypad" is defined as an input device that enables a user to provide information into a machine-perceivable form. A keypad can, for example, comprise electromechanical devices, electro-capacitance devices, electro-thermal devices, etc.

A salient characteristic of wireless terminal assembly 100 is that display module 102 and battery module 103 are mounted on opposite faces of printed circuit board assembly 101. Typically, battery module 103 is removably-mounted on printed circuit board assembly 101 via one or more mechanical connectors (e.g., a latch and catch, etc.) and electrical connectors. For the purposes of this specification, the term "removably-mounted" is defined as mechanically connected but removable by a user without tools. For the purposes of this specification, the term "permanently-integrated" is defined as mechanically connected but not removable by a user without tools.

One consequence of mounting display module 102 and battery module 103 on opposite sides of printed circuit board assembly 101 concerns the overall thickness of wireless terminal assembly 100. Because display module 102 is typically the thickest module on one face of printed circuit board assembly 101 and battery. module 103 is typically the thickest module on the opposite face of printed circuit board assembly 101, the overall thickness of wireless terminal assembly 100 is typically constrained by the sum of the thicknesses of display module 102, printed circuit board assembly 101 and battery module 103 and as shown in FIG. 1.

Figure 2:
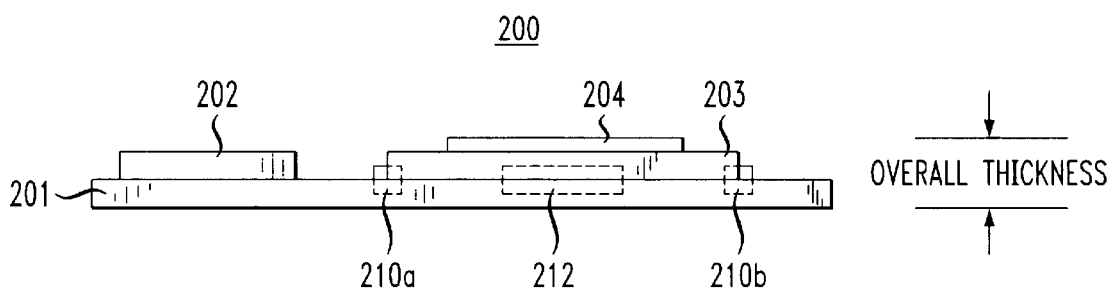
FIG. 2 depicts a side-view of a wireless terminal assembly in accordance with the first illustrative embodiment of the present invention.

FIG. 2 depicts a side-view of wireless terminal assembly 200, in accordance with the first illustrative embodiment of the present invention. Wireless terminal assembly 200 comprises: printed circuit board assembly 201, display module 202, battery module 203, integrated keypad 204, mechanical connector 21a, mechanical connector 210b, and electrical connector 212. Some components typically associated with an operational wireless terminal assembly (e.g., a speaker, microphone, etc.) are not depicted in FIG. 2 so that the drawings and description can focus on those components that are germane to an understanding of the present invention. In other words, some components are neither depicted in FIG. 2 nor described because their inclusion might hinder an understanding of the present invention.

A salient characteristic of wireless terminal assembly 200 is that display module 202 and battery module 203 are mounted on the same face of printed circuit board assembly 201. This enables wireless terminal assembly 200 to be thinner than wireless terminal assembly 100 without a fundamental change in the basic technology with which the individual components of both assemblies are made.

Advantageously, battery module 203 is removably-mounted on printed circuit board assembly 201 with one or more mechanical connectors (e.g., mechanical connector 210a and mechanical connector 210b) and electrical connectors (e.g., electrical connector 212). Advantageously, printed circuit board assembly 201 or battery module 203 or both comprise the mechanical connectors and electrical connectors that enable battery module 203 to be removably-mounted on printed circuit board assembly 201.

Because battery module 203 is mounted on that portion of printed circuit board assembly 201 that is typically occupied by a keypad, battery module 203 advantageously comprises keypad 204.

Figure 3:
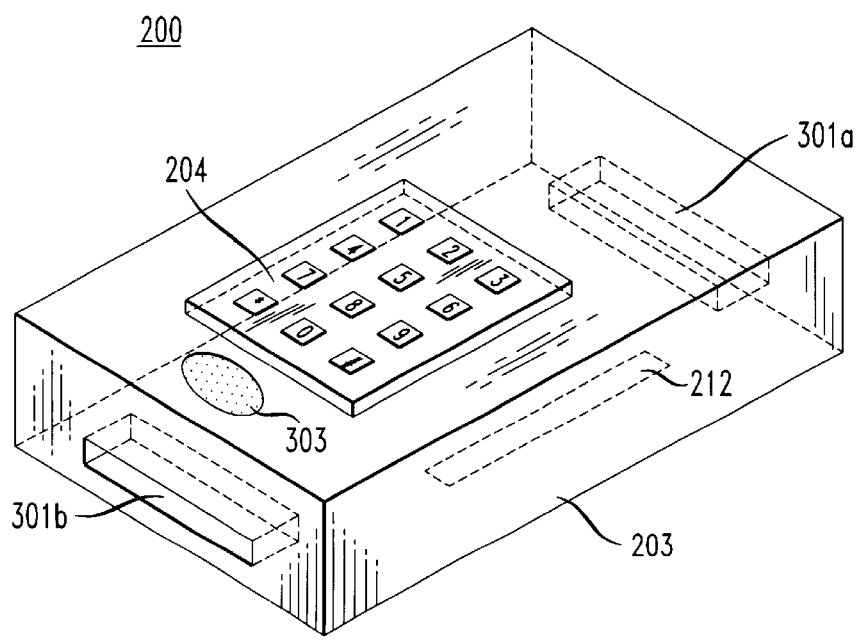
FIG. 3 depicts an isometric depiction of battery module 203 as shown in FIG. 2.

FIG. 3 depicts an isometric drawing of battery module 203, which comprises: catch 301a, catch 301b, keypad 204, and microphone facade 303. Catch 301a and catch 301b are the catches for mechanical connectors 210a and 210b, respectively, for attaching battery module 203 to printed circuit board assembly 201. It will be clear to those skilled in the art how to mechanically attach battery module 203 to printed circuit board assembly 201 using any of many well-known techniques.

In accordance with some embodiments of the present invention, keypad 204 is permanently-integrated into battery module 203, and, therefore, when battery module 203 is swapped out for another battery module, keypad 204 is also swapped out for a keypad on the replacement battery module. In accordance with other embodiments of the present invention, keypad 204 is removably-mounted on battery module 203, and, therefore when battery module 203 is swapped out for another battery module, keypad 204 can be mounted on the replacement battery module. In either case, keypad 204 is electrically connected to printed circuit board assembly 201 though electrical connector 212 when battery module 203 is mounted on printed circuit board assembly 201.

Because battery module 203 forms a substantial portion of the visible front of wireless terminal assembly 200, battery modules can be fabricated in different colors and finishes to facilitate a change in the look of wireless terminal assembly 200. Although this is merely a cosmetic change, many users of wireless terminals might like being able to change the look of their wireless terminal for different occasions.

Because battery module 203 might be mounted on printed circuit board assembly 201 in a position that many less-technologically sophisticated users might expect to see a microphone, battery module 203 advantageously comprises microphone facade 303, which is not a microphone at all, but is merely a cosmetic device (e.g., a series of holes, a screen, etc.) to deceive the user into thinking that the microphone is indeed where they expect it to be. Therefore, microphone facade 303 provides them with the comfortable feeling that wireless terminal assembly 200 is constructed as they perceive it should be, and this might make a prospective purchaser of wireless terminal assembly 200 more likely to purchase it than if microphone facade 303 were absent.

Figure 4:
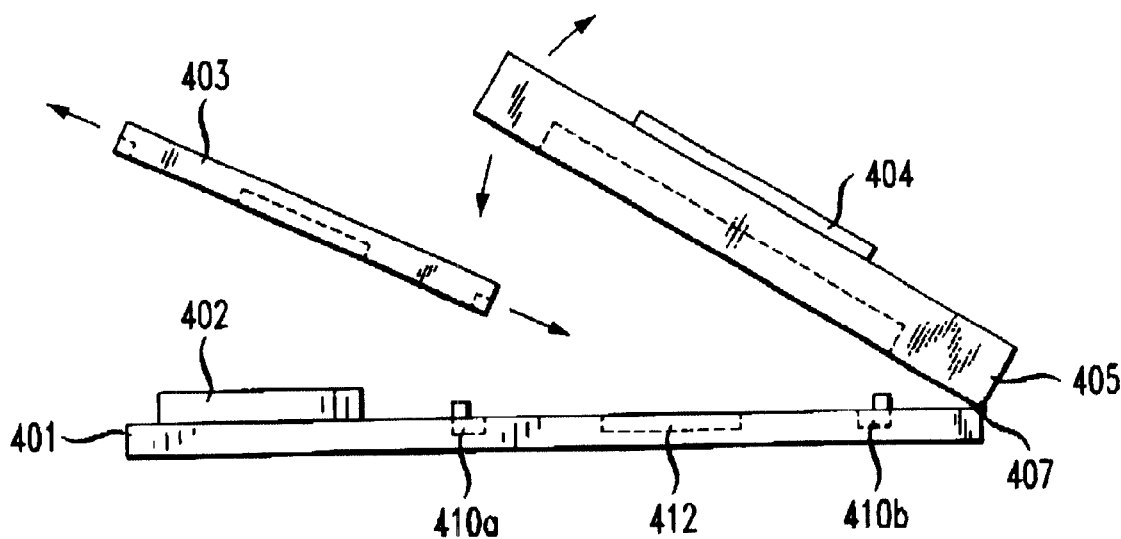
FIG. 4 depicts a side-view of wireless terminal assembly in accordance with the second illustrative embodiment of the present invention, and in which hinged hood 405 is in the "open" position.

FIG. 4 depicts a side-view of wireless terminal assembly 400, in accordance with the second illustrative embodiment of the present invention. Wireless terminal assembly 400 comprises printed circuit board assembly 401, display module 402, hinged hood 405 in the "open" position, permanently-integrated keypad 404, hinge 407, mechanical connectors 410a and 410b, and electrical connector 412. Also shown in FIG. 4 is battery module 403 as it appears with respect to wireless terminal assembly 400 when it is being both inserted into wireless terminal assembly 400 and when it is being removed from wireless terminal assembly 400. Advantageously, battery module 403 is removably mounted on printed circuit board assembly 401 via mechanical connectors (e.g., a spring-loaded latch and catch, etc.) and electrical connectors so that it can be easily removed and replaced with another battery module by a user without tools.

Figure 5:
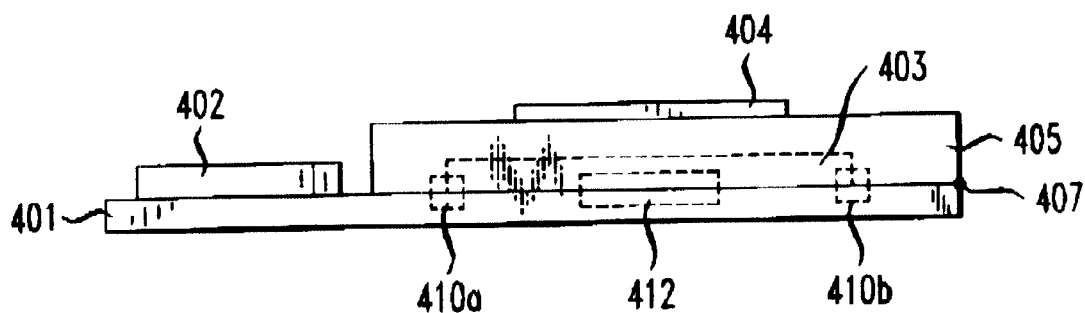
FIG. 5 depicts a side-view of wireless terminal assembly in accordance with the second illustrative embodiment of the present invention, and in which hinged hood 405 is in the "closed" position and covers at least a portion of battery module 403.

FIG. 5 depicts a side-view of wireless terminal assembly 400, in which hinged hood 405 is in the "closed" position and covers all or a portion of battery module 403. From the foregoing, it will be clear to those skilled in the art how to make and use wireless terminal assembly 400 and its respective components.

Figure 6:
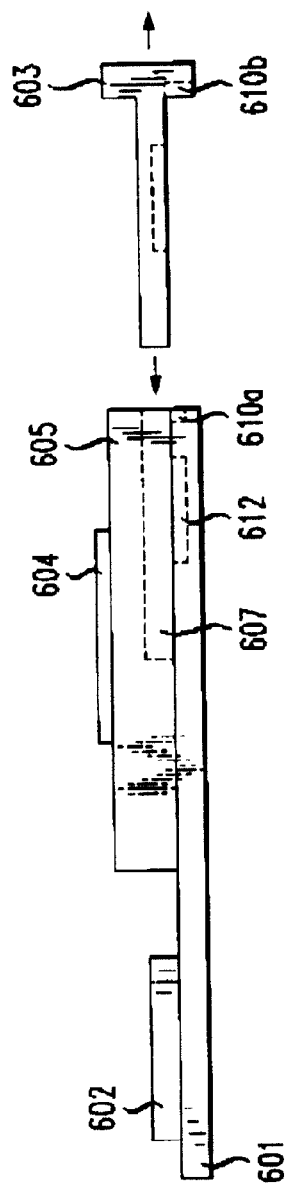
FIG. 6 depicts a side-view of wireless terminal assembly in accordance with the third illustrative embodiment of the present invention, and in which garage 605 is empty.

FIG. 6 depicts a side-view of wireless terminal assembly 600, in accordance with the third illustrative embodiment of the present invention. Wireless terminal assembly 400 comprises printed circuit board assembly 601, display module 602, garage 605 with cavity 607, permanently-integrated keypad 604, mechanical connector 610a, and electrical connector 612. Also shown in FIG. 6 is battery module 603 with mechanical connector 610b as it appears with respect to wireless terminal assembly 600 when it is being both inserted into garage 605 and when it is being removed from garage 605. Advantageously, battery module 603 is removably mounted in garage 605 and on printed circuit board assembly 601 via mechanical connectors (e.g., a spring-loaded latch and catch, etc.) and electrical connectors so that it can be easily removed and replaced with another battery module by a user without tools.

Figure 7:
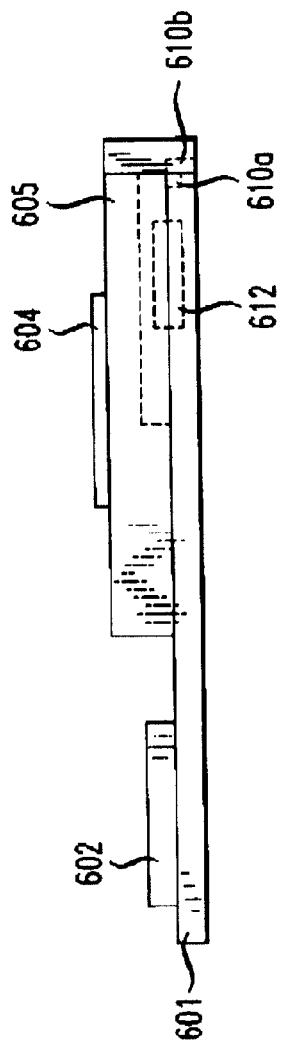
FIG. 7 depicts a side-view of wireless terminal assembly in accordance with the third illustrative embodiment of the present invention, and in which at least a portion of battery module 603 is enclosed within garage 605.

FIG. 7 depicts a side-view of wireless terminal assembly 600, in which all or a portion of battery module 603 is enclosed within garage 605. From the foregoing, it will be clear to those skilled in the art how to make and use wireless terminal assembly 600 and its respective components.

It is to be understood that the above-described embodiments are merely illustrative of the invention and that many variations may be devised by those skilled in the art without departing from the scope of the invention. It is therefore intended that such variations be included within the scope of an the following claims and their equivalents.

What is claimed is:

1. A wireless terminal assembly comprising:
   a numeric keypad;
   a printed circuit board assembly having a first face and a second face;
   a display module that is mounted on said first face of said printed circuit board assembly and that is electrically connected to said printed circuit board assembly; and
   a battery module operative to supply electrical power to said printed circuit board, said battery module being detachably positionable on said first face of said printed circuit board assembly and being electrically connected to said printed circuit board assembly when mounted on said first face of said printed circuit board assembly, wherein at least a portion of said battery module is beneath said numeric keypad.

2. The wireless terminal assembly of claim 1 wherein said numeric keypad is permanently-integrated on said battery module and is removably-mounted therewith from said first face of said printed circuit board assembly, said numeric keypad being electrically connected to said printed circuit board assembly when said battery module is mounted on said first face of said printed circuit board assembly.

3. The wireless terminal assembly of claim 1 wherein said numeric keypad is removably-mounted on said battery module, wherein said removably-mounted keypad is electrically connected to said printed circuit board assembly when said battery module is mounted on said first face of said printed circuit board assembly.

4. The wireless terminal assembly of claim 1 further comprising a hinged hood that is manipulable between a first position exposing the first surface of said printed circuit board for placement of said battery module and a second position capable of covering at least a portion of said battery module.

5. The wireless terminal assembly of claim 4 wherein said numeric keypad is disposed on said hinged hood and is electrically connected to said printed circuit board assembly.

6. The wireless terminal assembly of claim 1 further comprising a garage that defines a cavity dimensioned and arranged to receive and enclose at least a portion of said battery module.

7. The wireless terminal assembly of claim 6 wherein said numeric keypad is disposed on said garage and is electrically connected to said printed circuit board assembly.

8. The wireless terminal assembly of claim 1 wherein said battery module further comprises a microphone facade, wherein said microphone facade is disposed at a location different from a microphone that is within said wireless terminal assembly, wherein said microphone facade provides said wireless terminal assembly with a conventional aesthetic appearance.

9. A wireless terminal assembly comprising:
   a numeric keypad;
   a printed circuit board assembly having a first face and a second face;
   a display module that is mounted on said first face of said printed circuit board assembly and that is electrically connected to said printed circuit board assembly; and
   a mechanical connector dimensioned and arranged to retain, in a position extending at least partially beneath said numeric keypad, a battery module on said first face of said printed circuit board assembly, said battery module being electrically connectable to said printed circuit board assembly when mounted on said first face of said printed circuit board assembly.

10. The wireless terminal assembly of claim 9 wherein said numeric keypad is permanently-integrated with said battery module, said numeric keypad being electrically connected to said printed circuit board assembly when said battery module is mounted on said first face of said printed circuit board assembly.

11. The wireless terminal assembly of claim 9 wherein said numeric keypad is removably-mounted on said battery module, said numeric keypad beings electrically connected to said printed circuit board assembly when said battery module is mounted on said first face of said printed circuit board assembly.

12. The wireless terminal assembly of claim 9 further comprising a hinged hood that is capable of covering at least a portion of said battery module.

13. The wireless terminal assembly of claim 12 wherein said numeric keypad is permanently-integrated with said hinged hood, said numeric keypad being electrically connected to said printed circuit board assembly.

14. The wireless terminal assembly of claim 9 further comprising a garage defining a cavity dimensioned and arranged to receive and enclose at least a portion of said battery module.

15. The wireless terminal assembly of claim 14 wherein said numeric keypad is permanently-integrated with said garage, said numeric keypad being electrically connected to said printed circuit board assembly.

16. The wireless terminal assembly of claim 9 further comprising a microphone, wherein said battery module further comprises a microphone facade disposed at a location different from said microphone to provide a user of said wireless terminal assembly with a conventional aesthetic appearance.

17. A wireless terminal assembly comprising:
- a printed circuit board assembly having a first face and a second face;
- a keypad;
- a display module electrically connected to said printed circuit board assembly and mounted on said first face of said printed circuit board assembly; and
- a hinged hood that is capable of covering at least a portion of a battery module removably-mounted on said first face of said printed circuit board assembly, wherein said battery module is electrically connected to said printed circuit board assembly when said battery module is mounted on said first face of said printed circuit board assembly so as to be disposed at least partially beneath said keypad.

18. The wireless terminal assembly of claim 17 herein said keypad is permanently integrated with said hinged hood, said keypad being electrically connected to said printed circuit board assembly.

19. A wireless terminal assembly comprising:
- a printed circuit board assembly having a first face and a second face;
- a keypad electrically connectable to said printed circuit board assembly;
- a display module electrically connected to said printed circuit board assembly and mounted on said first face of said printed circuit board assembly; and
- a garage that is capable of enclosing at least a portion of a removably-mounted battery module on said first face of said printed circuit board assembly, wherein said battery module is electrically connected to said printed circuit board assembly when said battery module is mounted on said first face of said printed circuit board assembly so as to be disposed at least partially beneath said keypad.

20. The wireless terminal assembly of claim 19 wherein said keypad is permanently integrated with said garage.

* * * * *